United States Patent [19]
Brock et al.

[11] 3,967,368
[45] July 6, 1976

[54] METHOD FOR MANUFACTURING AND USING AN INTERNALLY BIASED MAGNETORESISTIVE MAGNETIC TRANSDUCER

[75] Inventors: George W. Brock, Boulder; Frank B. Shelledy, Longmont, both of Colo.

[73] Assignee: International Business Machines Corporation, Armonk, N.Y.

[22] Filed: Apr. 30, 1975

[21] Appl. No.: 572,976

Related U.S. Application Data

[60] Continuation of Ser. No. 448,132, March 4, 1974, abandoned, which is a division of Ser. No. 296,742, Oct. 11, 1972, Pat. No. 3,813,692.

[52] U.S. Cl. .................................. 29/603; 360/113; 427/124; 427/131; 427/132
[51] Int. Cl.² ........................................... G11B 5/42
[58] Field of Search .............. 29/603; 360/112, 113; 340/174 EB; 427/131, 132, 123, 124

[56] References Cited
UNITED STATES PATENTS

| | | | |
|---|---|---|---|
| 3,256,483 | 6/1966 | Broadbent | 360/113 |
| 3,366,939 | 1/1968 | DeChanteloup | 340/174 EB |
| 3,731,007 | 5/1973 | Masuda et al. | 360/113 |
| 3,738,865 | 6/1973 | Takeno et al. | 427/131 |

*Primary Examiner*—Carl E. Hall
*Attorney, Agent, or Firm*—Gunter A. Hauptman

[57] ABSTRACT

A magnetic transducer exhibiting the magnetoresistive (MR) effect is made by depositing at least two thin film layers. An MR film placed in electrical contact with a higher resistivity layer is magnetically biased by a portion of the MR sense current shunted through the nonmagnetic layer.

2 Claims, 5 Drawing Figures

METHOD FOR MANUFACTURING AND USING AN INTERNALLY BIASED MAGNETORESISTIVE MAGNETIC TRANSDUCER

CROSS-REFERENCES TO RELATED APPLICATION

This application is a continuation of Ser. No. 448,132, filed Mar. 4, 1974 now abandoned, which is a division of Ser. No. 296,742, filed Oct. 11, 1972 now U.S. Pat. No. 3,813,692, entitled "Internally Biased Magnetoresistive Magnetic Transducer," by the same inventors and commonly assigned.

FIELD OF THE INVENTION

The invention relates to the manufacture of magnetoresistive transducers and more particularly to the methods of making magnetic biased, thin film, magnetic read heads including magnetoresistive material.

PRIOR ART

A magnetoresistive (MR) element exhibits a change in resistance as a function of the magnetic flux $\phi$ to which it is exposed. This characteristic should be compared to more conventional devices which sense the rate of change of magnetic flux $d\phi/dt$ and, therefore, supply signals dependent upon the rate of change and not the flux density. Thus, for example, the output from a conventional head for reading information from a magnetic medium is a function of the medium's velocity (which determines the rate of change of the magnetic flux sensed by the head) and is operable over only a relatively narrow range of medium speeds. On the other hand, an MR element will give a constant output over an extremely wide range of medium speeds because its operation is independent of the rate of the magnetic flux changes. The MR effect should also be distinguished from the Hall effect where a magnetic field causes a potential to appear across a material as a function of the field's flux density B. Hall devices, like MR devices, do not require motion relative to the magnetic field; however, Hall and MR devices are otherwise quite different in the materials used, noise generated, usable frequency ranges, ease of fabrication, etc. As discussed in Green U.S. Pat. No. 3,379,895, issued Apr. 23, 1968, the MR and Hall effects are antithetic.

The change in resistance $\Delta R$ of an MR device is an essentially nonlinear function of the strength of the field H to which the device is exposed. For most applications, for example magnetic read al it is desirable to center operation in the most linear 1962, This has usually been accomplished by supplying a fixed bias field separated by either an electromagnet as in U.S. Pat. No. 1,596,558, granted Aug. 17, 1926, to B. N. Sokoloff, or the permanent magnet of U.S. Pat. No. 2,500,959, granted Mar. 21, 1950, to M. L. Lisman. In order to reduce the structural size of MR devices, thin film technology has made it possible to bias an MR element, deposited as a film on a substrate, with a current applied to another thin film. For example, Grant et a. U.S. Pat. No. 3,016,507, issued Jan. 9, 1062, shows a thin film deposited MR device and bias conductor separted by an insulator. The function of the conductor is eliminated in U.S. Pat. No. 3,366,939, granted Jan. 30, 1968, to de Chanteloup, where electric control current through a thin film MR element generates a field causing a change in the film's resistance which is then sensed by a separate signal processing circuit. Copeland U.S. Pat. No. 3,678,478, issued July 18, 1972, achieves partial self-biasing of separated single wall domain layers.

None of the foregoing art is directed toward eliminating the separate bias and sensing circuits required for a thin film MR element read head. The above-cited de Chanteloup patent merges separate bias and sense current in a control device, thus eliminating an extra bias conductor, but still requiring a separate bias source. The Copeland patent does not address MR technology and suggests that an external magnetic field is still required. It has been suggested in the prior art that MR elements, usually formed of a single layer of one material, be made in a number of layers of different materials. U.S. Pat. No. 2,984,825, granted May 16, 1961, to Fuller et al, suggests layers of magnetic material separated by insulators and connected in parallel to a single current source. Hardening materials such as copper, aluminum, etc., are deposited on an otherwise conventionally used MR element in Broadbent U.S. Pat. No. 3,256,483, issued June 14, 1966. Collins et al U.S. Pat. No. 3,592,708, issued July 13, 1971, and U.S. Pat. No. 3,617,975, issued Nov. 2, 1971, to Wieder, shorten magnetic shunt paths or short-circuit Hall fields believed to adversely effect MR device sensitivity. Ferrite layers for magnetic field concentration in a conventionally biased MR head are suggested in Hunt U.S. Pat. No. 3,943,694, granted Feb. 3, 1970. An atricle by Ahn and Hendel in the IBM TECHNICAL DISCLOSURE BULLETIN, November, 1971, page 1850, suggests providing a bias field for bubble domain devices by depositing a magnetically biased Permalloy layer on the magnetic substrate to reduce the external bias field by at least 25%.

Applicants have discovered that such conventional bias source may be completely eliminated and the performance and reliability of MR elements simultaneously improved by mating an MR layer and a shunt bias layer without intervening insulation. This permits the design of unusually simple and practical magnetic media read heads and sensing circuits usable over a wide range of medium velocities. The shunt layer: (1) eliminates a separate bias path by generating the bias field directly from a portion of the sensing current applied to the device, (2) increases MR reliability by providing a shunt current path around defects in the MR layer, (3) simplifies manufacture by eliminating hard-to-deposit thin insulating films which often break down during use, and (4) reduces costs by eliminating one conductor and two contacts, and a separate external bias circuit.

In Applicants' invention, a thin film of material exhibiting the MR effect and a thin shunt bias film of a relatively higher resistivity material are intimately mated and suitably supported in magnetic fields representing information stored on media. Changes in resistance resulting from changes in the field are detected by monitoring current through the combination.

The foregoing and other objects, features, and advantages of the invention will be apparent from the following more particular descripiton of preferred embodiments of the invention, as illustrated in the accompanying drawings.

IN THE DRAWINGS

DETAILED DESCRIPTION

Figure 1A:
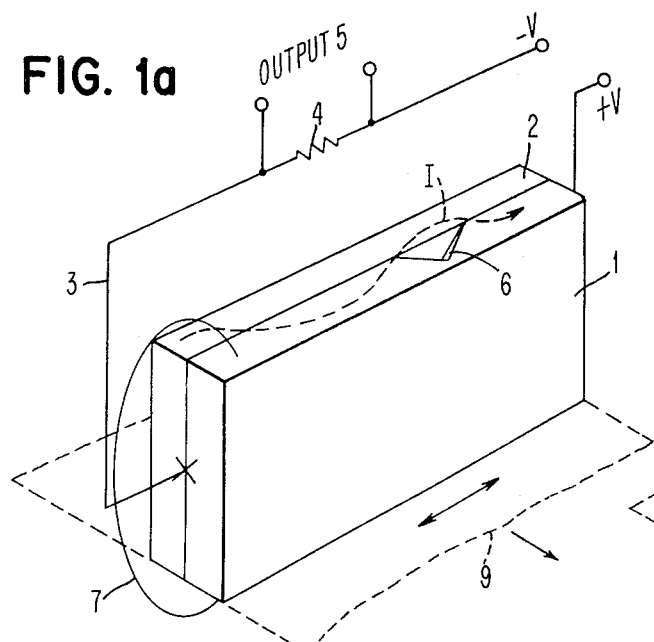
FIG. 1a is a line drawing of a two-film device illustrating the invention and FIG. 1b is a characteristic curve for the FIG. 1a device.

Referring to FIG. 1a, there is shown a magnetoresistive (MR) film intimately electrically in contact with an underlying layer 2. A substrate may provide physical support to either, or both, layers. The films form a magnetoresistive device intended for sensing magnetic flux. For example, the device may be used as a fixed, movable, hand-held, etc. transducer for sensing magnetic flux from information stored on an illustrative magnetic medium 9 such as a magnetic tape, card, tag, label, disc, drum, etc. Magnetization patterns on the medium will intercept the MR film and effect its resistance as a function of information manifested by the patterns. An electrical current is supplied via a wire 3 from a voltage source V. The current enters the layers 1 and 2 in such a way as to flow through both layers. An entrance at the interface between the two layers is shown for purposes of illustration only inasmuch as the current may first enter either the layer 1 or the layer 2. The current flowing in the wire 3 is determined by the voltage and the combined resistance of the wire 3, the layers 1 and 2, and a resistor 4 in accordance with Ohm's law. Therefore, there will appear, at an output a voltage inversely proportional to the combined resistance of the two films 1 and 2. The current flowing through the films 1 and 2 is split between the two layers in inverse proportion to their resistance; the portion through the layer 2 creating a magnetic field 7 which intercepts the magnetoresistive (MR) film 1. In this manner, the MR film 1 is provided with a bias fixed by the amount of current flowing through the layer 2. While the current portion in the MR film also causes a magnetic field 7, which intercepts the layer 2, this field is not believed to be utilized in the invention.

Figure 1B:
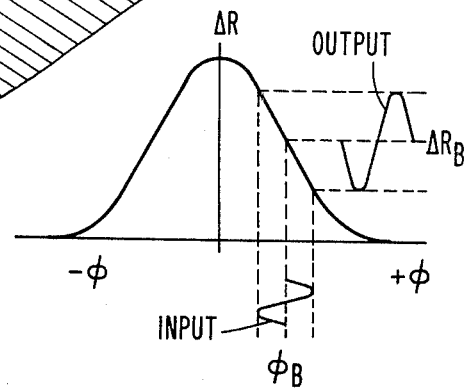

A further understanding of the bias to which MR film 1 is subjected may be gained from FIG. 1b. The change in resistance $\phi R$ resulting from given magnetic field values $\phi$ is illustrated by the curve. An input magnetic field signal (from an associated magnetic media) will cause an output resistance change varying about a resistance $\Delta R_B$ determined by a magnetic bias $\phi_B$. The value of the bias is chosen to give an output signal having minimum distortion by centering $\Delta R_B$ in the most linear region of the curve. In the disclosed invention, $\phi_B$ is a function of the film 2 current portion. The film 2 has been found to give an additional benefit. Frequently, in the manufacture of devices including very thin films, defects occur in one or more films. In FIG. 1a, a hole 6 is assumed to have occurred during the deposition of the film 1 on the film 2. It will be understood that many different types of defects may occur during manufacture or subsequent to manufacture during the use of the device. For example, cracks frequently occur in one or the other of the layers. Such defects present a barrier to flow of current and thus effect the operation of the circuit in which the device is used inasmuch as the MR resistance layer will not bear the desired relationship to the magnetic field to which the device is exposed. The current I is shown as flowing into layer 2 to pass around the defect. In the absence of the layer 2, the effect would present a significant barrier to the current I through the film 1. However, due to the present of the layer 2, the current is able to shunt around the defect and thus flow unimpeded through the combined layers 1 and 2.

The choice of materials for the films 1 and 2 in FIG. 1a is a significant consideration. The magnetoresistive film 1 may be constructed of any materials currently used for such purposes or exhibiting a magnetoresistive effect. For example, it is believed that nickel-iron (NiFe) is a practical choice for the film 1 because it has a low $H_C$, high permeability and, of course, sensitive magnetoresistive characteristics. Among the many materials meeting this requirement are nickel-iron (Permalloy), nickel, etc. The thickness of the film 2 must be chosen to avoid very thin films (which are hard to deposit and do not provide homogeneous electrical resistance) and very thick films (which are unsuitable for receiving a magnetoresistive deposition because they are too rough). Thus, if a very thin magnetoresistive film 1, on the order of 300 angstroms is used, a relatively thicker shunt bias film on the order of 1,350 angstroms would be preferable and would appear to make processing easiest. The resistances of the shunt film 2 and the MR film 1 must permit sufficient current through the film 2 to provide magnetic bias for the film 1. This occurs for a variety of current proportions, for example, when the resistances are approximately equal and about 50% of the source current is shunted through layer 2. While it has been found that a 50% division of current gives an operable output, other divisions are quite satisfactory. For example, tests have shown that a 60% or 40% current division is almost 96% as good as a 50% division.

The resistivity of the shunt material (for equal surface areas) should be about equal to that of the MR material of layer 1 in order to meet the thickness and current criteria previously discussed. Available materials, however, give shunt resistivities as high as three or four times the MR material resistivity. The resistivity of the shunt film 2 may be much higher if only stabilization, to minimize the effect of defects, is required, since the current will then be too small for effective biasing. Titanium (Ti) has a desirable resistivity of 75 micro-ohm centimeters compared to 20 micro-ohm centimeters for nickel-iron MR layer 1. Gold (Au) (2.35 micro-ohm centimeters) and copper (Cu) (2.00 micro-ohm centimeters) are unsuitable. While tantalum (Ta) has not been tried, it is believed that it may have qualities similar to those of titanium and further has a resistivity very close to nickel-iron. In addition to the above significant materials considerations, the shunt film 2 must be easily etched during manufacture without undercutting, and it must also adhere to any substrate provided. For example, rhodium (Rh) is not a suitable shunt film because it cannot be etched. The shunt film chosen should not be subject to electron migration effects and should not interact with the film 1 or with other films in which it is placed in contact. It has been found that chromium (Cr) is not a suitable material if nickel-iron is used as the magnetoresistive layer 1 unless a separating layer is used between them. It being advantageous not to use a separating layer, it follows that chromium will not serve as an adequate shunt film.

Figure 2:
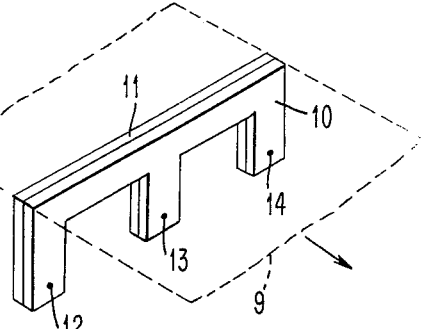
FIG. 2 is a drawing of a modified form of the FIG. 1a device incorporating the invention.

Referring now to FIG. 2, a modification of the device of FIG. 1a will now be explained. The device comprises a magnetoresistive layer 10 and a shunt layer 11 in an E configuration permitting the attachment of wires 12, 13, and 14. Characterization of the device as an E is not significant except insofar as it permits the attachment of a center tap 13 halfway between the connections 12 and 14. Any medium, for example a magnetic tape 9, is shown schematically in association with the device to indicate a source of magnetic flux. It will be understood that the device has many other uses and that the magnetic media may take many other forms such as drums or discs.

Figure 3:
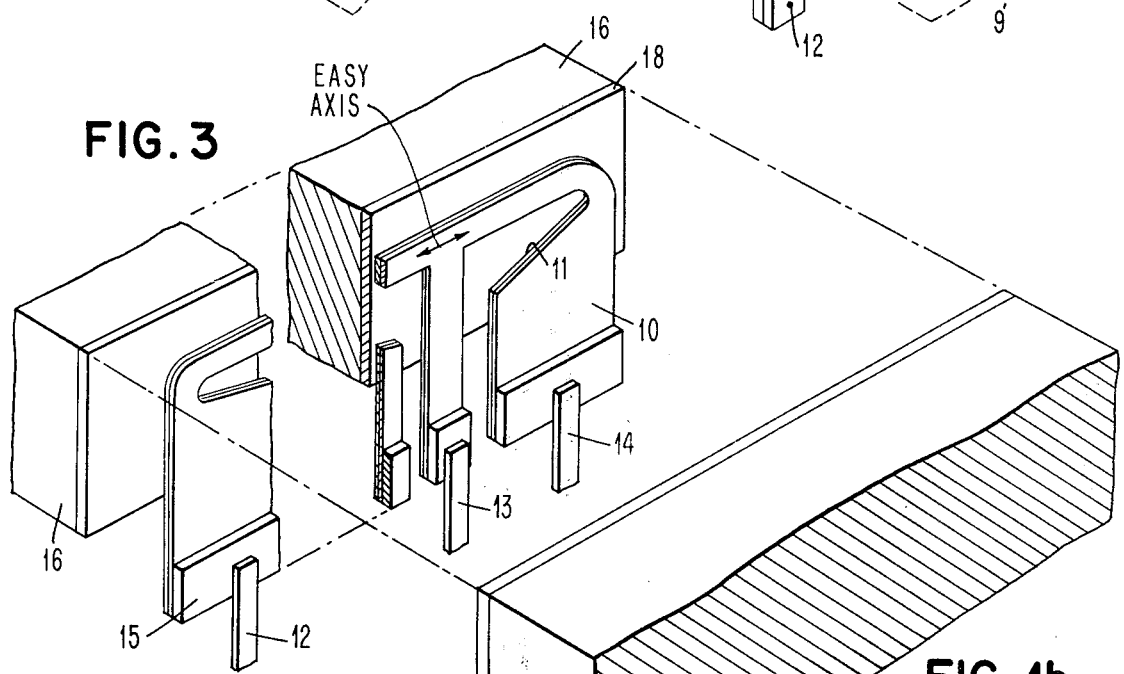
FIG. 3 is an exploded perspective view showing the details of construction of the device of FIG. 2.

The detailed construction and a method for manufacturing the device of FIG. 2 will be explained with reference to FIG. 3. Magnetoresistive nickel-iron layer 10 and titanium layer 11 in FIG. 2 appear in FIG. 3 as films formed on an $Al_2O_3$ layer 18 which in turn has been placed on ferrite pole piece 16. Copper connectors 12, 13, and 14 are bonded to a copper pad 15 which is deposited on nickel-iron layer 10. Another $Al_2O_3$ film 19 is placed over the device and a second ferrite pole piece 17 completes the device, which is, in this case, a shielded magnetic head. The pole pieces 16 and 17 form a complete magnetic path through a conventional back gap, not shown. The $Al_2O_3$ layers 18 and 19 provide a wear resistant surface at the head surface and also magnetically separate the layers 10 and 11 from the ferrite pole pieces. It will be understood, that if wear resistance is not desired or is provided for by some other means, it is possible to provide a substitute for the $Al_2O_3$ layers. The ferrite blocks 16 and 17, in addition to providing a magnetic circuit, also divert unwanted magnetic fields away from the MR layer 10.

An illustrative method of making the head of FIG. 3 will now be given:

Step 1 A ferrite substrate is provided.

Step 2 $Al_2O_3$ is sputtered over the entire surface of the ferrite substrate to a depth of 25 micro-inches.

Step 3 Titanium (Ti) is deposited on the $Al_2O_3$ surface by vacuum deposition to a depth of 1,800 angstroms.

Step 4 Permalloy is deposited to a depth of 600 angstroms. The Permalloy is oriented with a 40 oersted field to give an easy axis as shown.

Step 5 The vacuum is broken and a shield is placed over the substrate to mask it during the next step.

Step 6 Copper is vaccum deposited over the nickel-iron surface, except in the throat area, to a depth of 20 microinches.

Step 7 A photoresist is applied to the metallized substrate to expose a read track pattern.

Step 8 The Permalloy and copper are etched with a ferric chloride etchant.

Step 9 The etched material is rinsed and dried.

Step 10 The titanium is etched with hydrofluoric acid and the photoresist is removed.

Step 11 $Al_2O_3$ is sputtered over the entire surface to a depth of 10 microinches so that the tracks can be wired bonded.

Step 12 The $Al_2O_3$ is etched away to expose copper pads 15 using an appropriate etchant.

Step 13 Wire bonding is applied using standard techniques.

Step 14 A ferrite block coated with 15 microinches of $Al_2O_3$ is placed over the subassembly.

Figure 4:
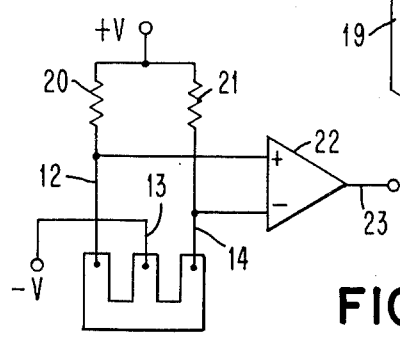
FIG. 4 is a schematic drawing illustrating a circuit for sensing signals in the device of FIGS. 2 and 3.

Referring now to FIG. 4, the circuit for utilizing the device of FIGS. 2 and 3 will now be described. The transducers leads 12, 13, and 14 are connected into a four-arm bridge circuit comprising two sections of the transducer and additional balancing resistors 20 and 21. The value of these resistors is chosen to control the bias current flowing through the layers 10 and 11 of the transducer as well as balancing the bridge. A differential amplifier 22 and a source of voltage V are connected across the bridge circuit. The output of the differential amplifier 23 will accurately portray the resistance changes in the layers 10 and 11 and attenuate distortion due to nonlinearity of the resistance/magnetic field curve of FIG. 1b.

It will be understood that many modifications of the invention are possible. For example, it is possible to provide magnetoresistive material for each layer. In such a case, the effects and optimum performance previously described will not be achieved, but other advantages may make such a substitution desirable. It is also possible in using more than two layers of magnetoresistive or shunt material to achieve common mode rejection and additive effects. In the specification, the terms film, layer, film layer, and the like are interchangeably used to identify thin laminar materials. Inasmuch as the underlying layer, for example layer 2 in FIG. 1a, serves several functions, it may be referred to as a stabilizing layer, shunt film, resistive layer, bias layer, etc.

While the invention has been particularly shown and described with reference to preferred embodiments thereof, it will be understood by those skilled in the art that various changes in form and details may be made therein without departing from the spirit and scope of the invention.

What is claimed is:

1. A method of manufacturing a magnetic read head including the steps of:

depositing a first layer of insulating material on a magnetic supporting substrate;

depositing a second layer of relatively conductive constant resistance material in contact with the first layer;

depositing a third layer of variable resistance material exhibiting a magnetoresistive effect directly in contact with the second layer;

applying a highly conductive metal to selected areas of the layers;

applying a mask to portions of the metalized areas;

etching the unmasked areas with an etchant to remove portions of the variable resistance material and highly conductive metal;

depositing a layer of insulating material over the remaining portions of the variable resistance material and highly conductive metal; and placing a magnetic covering over aforesaid layer wherein said magnetic covering and said magnetic substrate comprise pole pieces in said magnetic read head.

2. The method of claim 1 wherein the second layer is a material belonging to the class of materials including titanium and the third layer is a material belonging to the class of materials including Permalloy.

* * * * *